(12) United States Patent
Mendoza et al.

(10) Patent No.: US 10,847,921 B2
(45) Date of Patent: Nov. 24, 2020

(54) TEST PLUG FOR A FT SWITCH

(71) Applicant: ABB Schweiz AG, Baden (CH)

(72) Inventors: Malbin Jose Mendoza, Weston, FL (US); Todd Gentile, Tamarac, FL (US); Prerak Shah, Coral Springs, FL (US); Arkady Oksengorn, Boca Raton, FL (US)

(73) Assignee: ABB Schweiz AG, Baden (CH)

( * ) Notice: Subject to any disclaimer, the term of this patent is extended or adjusted under 35 U.S.C. 154(b) by 68 days.

(21) Appl. No.: 16/236,932

(22) Filed: Dec. 31, 2018

(65) Prior Publication Data

US 2019/0341715 A1 Nov. 7, 2019

Related U.S. Application Data

(60) Provisional application No. 62/612,387, filed on Dec. 30, 2017.

(51) Int. Cl.
*H01R 24/20* (2011.01)
*H01R 31/06* (2006.01)
*H01R 13/514* (2006.01)
*H01R 13/633* (2006.01)
*G01R 1/04* (2006.01)

(52) U.S. Cl.
CPC ......... *H01R 13/514* (2013.01); *G01R 1/0416* (2013.01); *H01R 13/6335* (2013.01); *H01R 24/20* (2013.01); *H01R 31/06* (2013.01); *H01R 2201/20* (2013.01)

(58) Field of Classification Search
CPC .. H01R 13/514; H01R 13/6335; H01R 31/06; H01R 24/20; H01B 1/026
See application file for complete search history.

(56) References Cited

U.S. PATENT DOCUMENTS

| | | | |
|---|---|---|---|
| 5,897,389 A * | 4/1999 | Dietz | H01R 13/7032 439/188 |
| 6,384,350 B1 * | 5/2002 | Shincovich | H01R 9/2433 200/5 A |
| 6,664,469 B1 * | 12/2003 | Sweeney | H01R 9/2458 174/135 |
| 6,946,843 B2 | 9/2005 | Fussell et al. | |
| 7,271,357 B2 * | 9/2007 | Ostmeier | G01R 1/0416 200/51.09 |
| 7,479,029 B2 * | 1/2009 | Cook | G01R 11/04 361/664 |
| 7,566,234 B2 * | 7/2009 | Hackemack | H01R 9/2458 200/51.1 |
| 7,586,052 B2 * | 9/2009 | Adunka | H01H 11/0031 200/293 |
| D621,784 S | 8/2010 | Bower et al. | |

(Continued)

*Primary Examiner* — Xuong M Chung Trans
(74) *Attorney, Agent, or Firm* — Taft Stettinius & Hollister LLP; J. Bruce Schelkopf

(57) ABSTRACT

A test plug has a housing with a first side that has inputs for receiving various connection types, a second side having blades and fingers extending therefrom, and a base. The first side extends at an oblique angle from the base, providing accessibility to the input connections thereon. The second side is capable of a removable connection to a test switch in which the fingers separate the current jack contacts before the electrical connection between the test plug blades and test switch jaws is made.

19 Claims, 11 Drawing Sheets

(56) References Cited

U.S. PATENT DOCUMENTS

| | | | |
|---|---|---|---|
| 8,007,312 B2* | 8/2011 | Bower | H01R 13/514 |
| | | | 439/540.1 |
| 8,400,161 B2 | 3/2013 | Belhumeur et al. | |
| 8,837,118 B2* | 9/2014 | McGrail | H01F 27/06 |
| | | | 361/663 |
| 9,004,956 B2* | 4/2015 | Wu | H01R 4/34 |
| | | | 439/709 |
| 9,153,916 B2* | 10/2015 | Schloo | H01R 13/703 |
| 2006/0059681 A1* | 3/2006 | Ball | G01R 31/3272 |
| | | | 29/622 |
| 2011/0028031 A1 | 2/2011 | Bower et al. | |
| 2018/0033566 A1* | 2/2018 | Mendoza | H01H 1/0015 |

* cited by examiner

TEST PLUG FOR A FT SWITCH

FIELD OF TECHNOLOGY

The present application is directed to a test plug for connection with a test switch.

BACKGROUND

Test switches are used as safe, reliable, and cost-effective means for wiring the output of relays, meters, and associated equipment to external devices for power source and in-service testing. Each switch pole is typically routed to a specific device or function for testing such as for mechanical disconnection of the voltage and current transformers from the relay. Test plugs are used to connect with the test switches and provide an injection of voltage and/or current upstream or downstream of the installation. Known test plugs need to be connected and reconnected via manual wiring of leads to the test switches. There is room in the art for improvement in the connection between test plugs and switches as well as the accessibility of the test plug connection surface once installed to the test switch.

SUMMARY

A test plug has a housing having a first side, a second side, a base and fingers extending from the second side, the first side having inputs for electrical connectors and the second side having the fingers and blades extending therefrom for removeable engagement with jaws of a test switch, the fingers extending beyond an end surface of the blades; and wherein when the test plug is connected to a test switch, the test plug fingers break the connection between current jacks of the test switch and the test plug blades make electrical contact with the jaws of the test switch.

A test plug, having a housing having a first side, a second side, a base. The housing first side extends at an oblique angle from a planar surface of the base and the first side has a plurality of inputs for electrical connections to inject current and voltage into the electrical system to which the test plug is connected. The housing second side has blades extending therefrom for removable engagement with jaws of a test switch.

A method for connecting a test plug to a test switch has the following steps: a. providing a test plug having a first side from which inputs extend and a second side from which fingers and a blade extend for insertion into corresponding current jack contacts and test switch jaws; b. separating the current jack contacts by inserting the fingers between the current jack contacts before the test plug blades and test switch jaws are engaged; and c. connecting the blades between the corresponding jaws of the test switch.

BRIEF DESCRIPTION OF THE DRAWINGS

In the accompanying drawings, structural embodiments are illustrated that, together with the detailed description provided below, describe exemplary embodiments of a test plug for a test switch. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
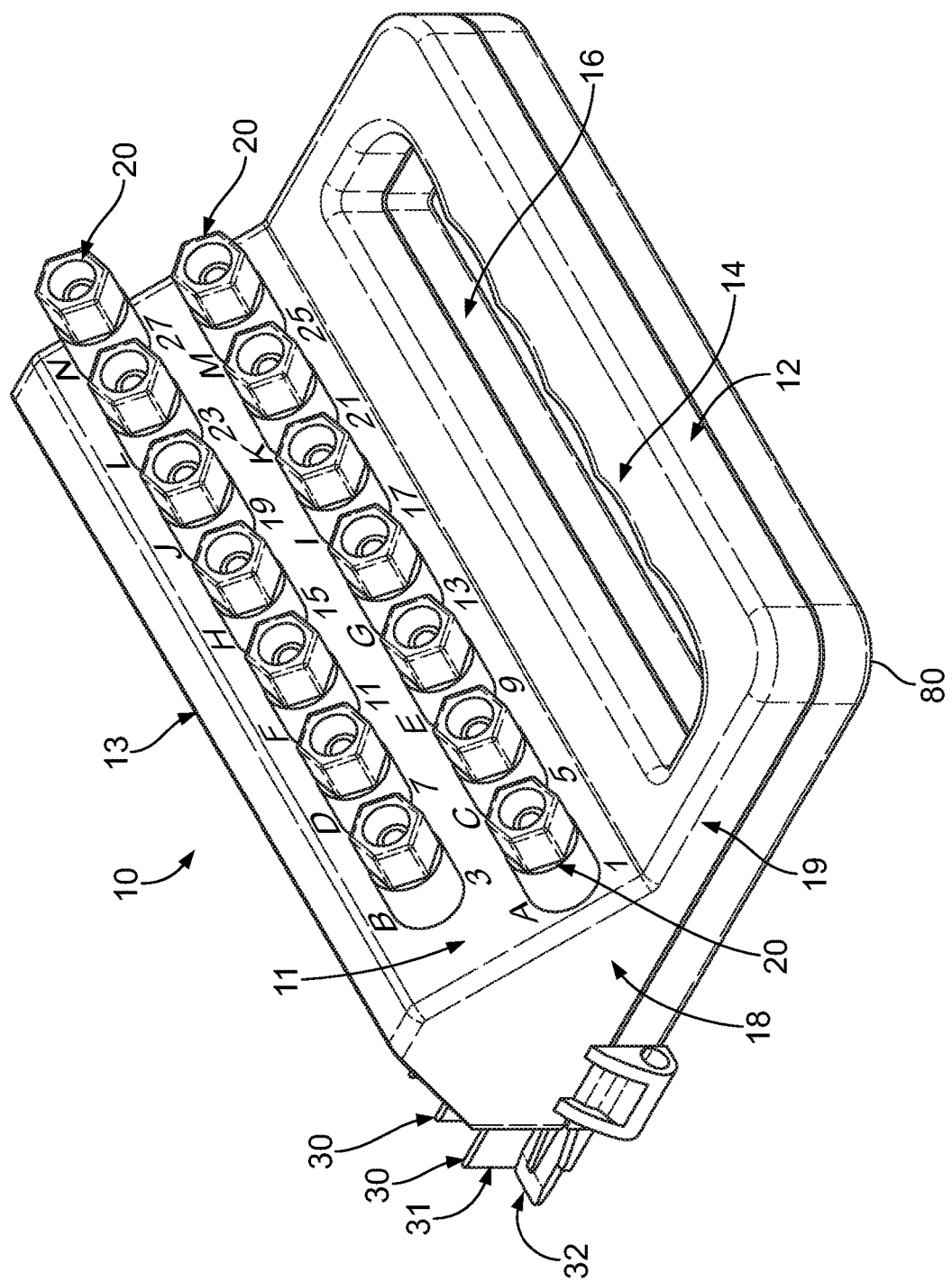
FIG. 1 is a view of the test plug showing multiple inputs for various connector types.
Figure 3:
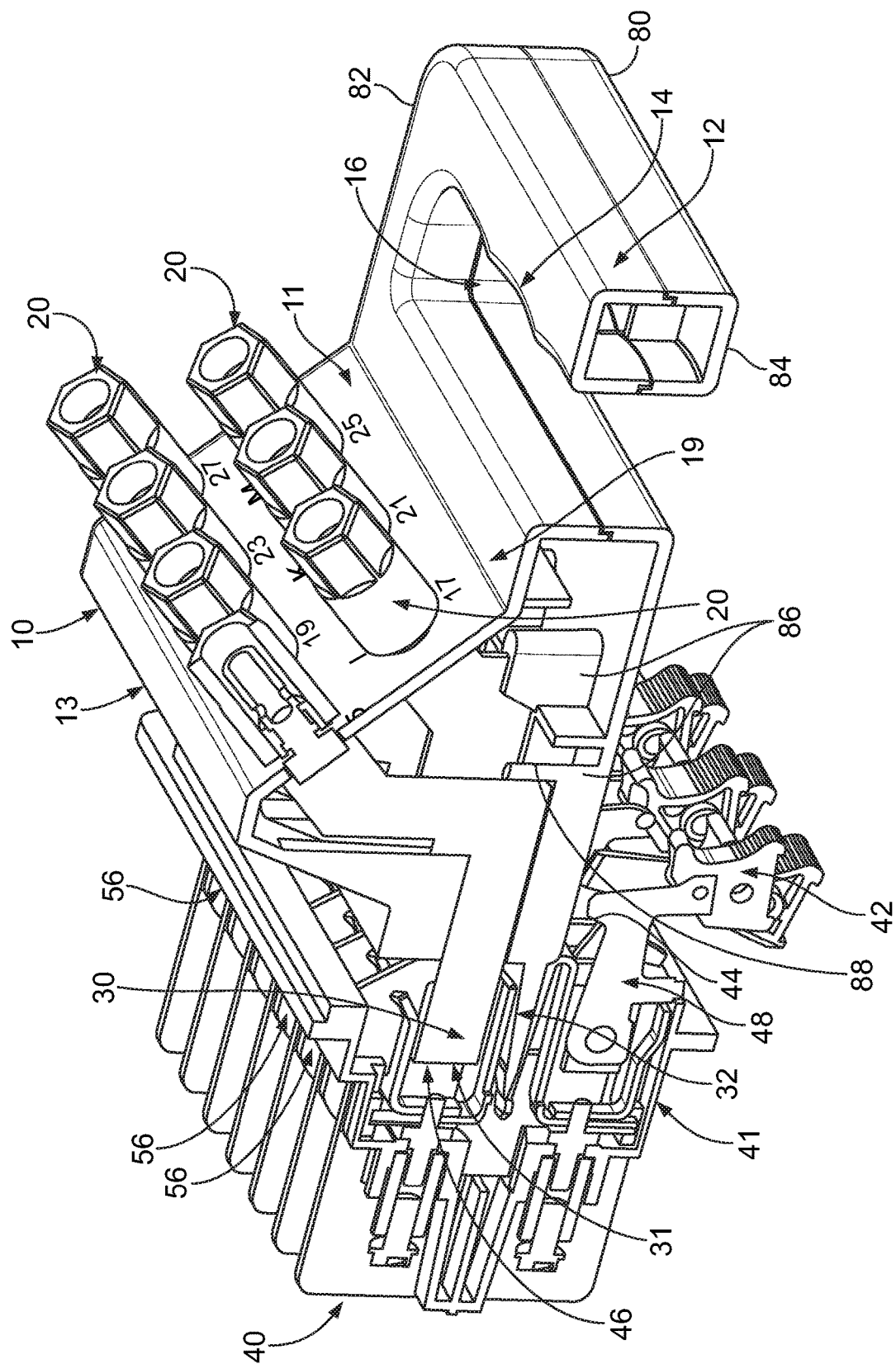
FIG. 3 is a cross sectional view of the test plug in connection with a test switch.

With reference to FIGS. 1 and 3, a test plug 10 for connection to a test switch 40 is shown. The test switch 40 is also known as an 'FT switch.' The test plug 10 has a plurality of inputs 20 for various connections. The plurality of inputs 20 are used to inject current and/or voltage into the electrical system, depending on the equipment being tested and the test switch 40 in the electrical circuit. In one embodiment, the test plug 10 has blades 30 that are capable of direct connection with a relay (not shown). It should be understood that the plurality of inputs 20 are for connection with banana-style, spade, probe and wire connectors, amongst other connection types. The test plug 10 is used to break the connection between the power source and connected relay in the electrical circuit and inject current and voltage through the inputs 20 thereof. Downstream current and/or potential transformers are disconnected from the relays and test switch 40 during testing.

The test switch 40 is connected with the power source such as current and voltage transformers and DC voltage on the first side and on the second side connected to a relay. When the test plug 10 is inserted into the test switch 40, the connection is broken between the power source and the relay in the circuit. Voltage and current is then injected into the test plug via inputs 20 to test the relay (not shown) and the electrical circuit on the relay side. The inputs can include a threaded nut which forms part of the connection. For example, the nut can be loosed to expose a conductive element to which a space probe can be connected. In some forms the threaded nut can include a central portion into which a banana plug can be inserted. The inputs need not include a threaded connection in some forms.

The test plug 10 has a housing 18 having first and second sides 11, 13, a base 19 and a handle 12 for ease of insertion and withdrawal of the test plug 10 from a corresponding test switch 40 as shown in FIG. 3. The handle 12 has an opening 16 and may be provided with grips 14 that are scalloped edges for interfacing with a user's hand and fingers. The first side 11 of the housing 18 has electrical connectors 20 for the injection of current and/or voltage into the electrical system. The first side 11 of the housing 18 extends at an oblique angle from a planar surface of the base 19 of the housing 18, for ease of access to the connection surface of the inputs 20. In one form the first side 11 extends at an oblique angle relative to the bottom base 80 of the housing 18. Either or both of the base 19 and bottom base 80 can be planar. The oblique angles of the first side 11 relative to either the base 19 or bottom base 80 can take any variety of forms. In one nonlimiting embodiment the oblique angle can be anywhere between 30 and 60 degrees. In one particular embodiment the oblique angle is 45 degrees. In one form the bottom base 80 extends from the handle 12 to a back side of the housing 18 from which fingers 32 extend. The housing 18 can be composed of at least two separate parts which can be joined together to form the whole. As illustrated in FIG. 3, one embodiment of the housing 18 can include a bottom half 82 and a top half 84. The bottom half 82 and top half 84 can be joined together as depicted along the part line in FIG. 3. Such joining can be by mechanical fastening (e.g. interference fit, etc), chemical bonding (e.g. gluing, etc), or any other suitable manner. The second side 13 of the housing 18 has blades 30 that are generally flat extending therefrom. The test plug blades 30 are electrically connected to the test plug input connections 20. The housing 18 includes fingers 32 that extend beyond the blades 30. The housing 18 and fingers 32 are formed of an electrically insulating material as well as the fingers 32 that extend from the housing 18. In one embodiment, the insulating material is a thermoplastic material. As will be appreciated given FIG. 3, the fingers can be formed as part of the bottom part of the shell of the housing, and accordingly can also be made of a thermoplastic material. As will also be appreciated, the fingers 32 can take on an insulated or nonconductive form. As will be further appreciated, the bottom half 82 and/or top half 84 can be made of a molded thermoplastic construction.

As can further be seen in FIG. 3, the blades 30 extend from the inputs 20 on one end and protrude from the housing 18 on the other. In the depicted embodiment the blades 30 are generally flat as depicted in FIG. 3 and rest upon supports 86 within the housing 18. The blades 30 can take the form of a stamped construction, such as a stamped copper construction. The blades 30, however, can take on other forms. For example, a portion of the blade 30 protruding from the housing 18 can be coupled with a wired lead which extends from the test inputs 20 to the blade 30 protruding from the housing 18. The supports 86 can be integral with the housing 18 in some forms (e.g. as depicted in FIG. 3), but can be integrated in other embodiments. In the illustrated embodiment the supports 86 can include a slotted heel 88 into which the blades 30 can be inserted to provide added stability to the construction.

Figure 2:
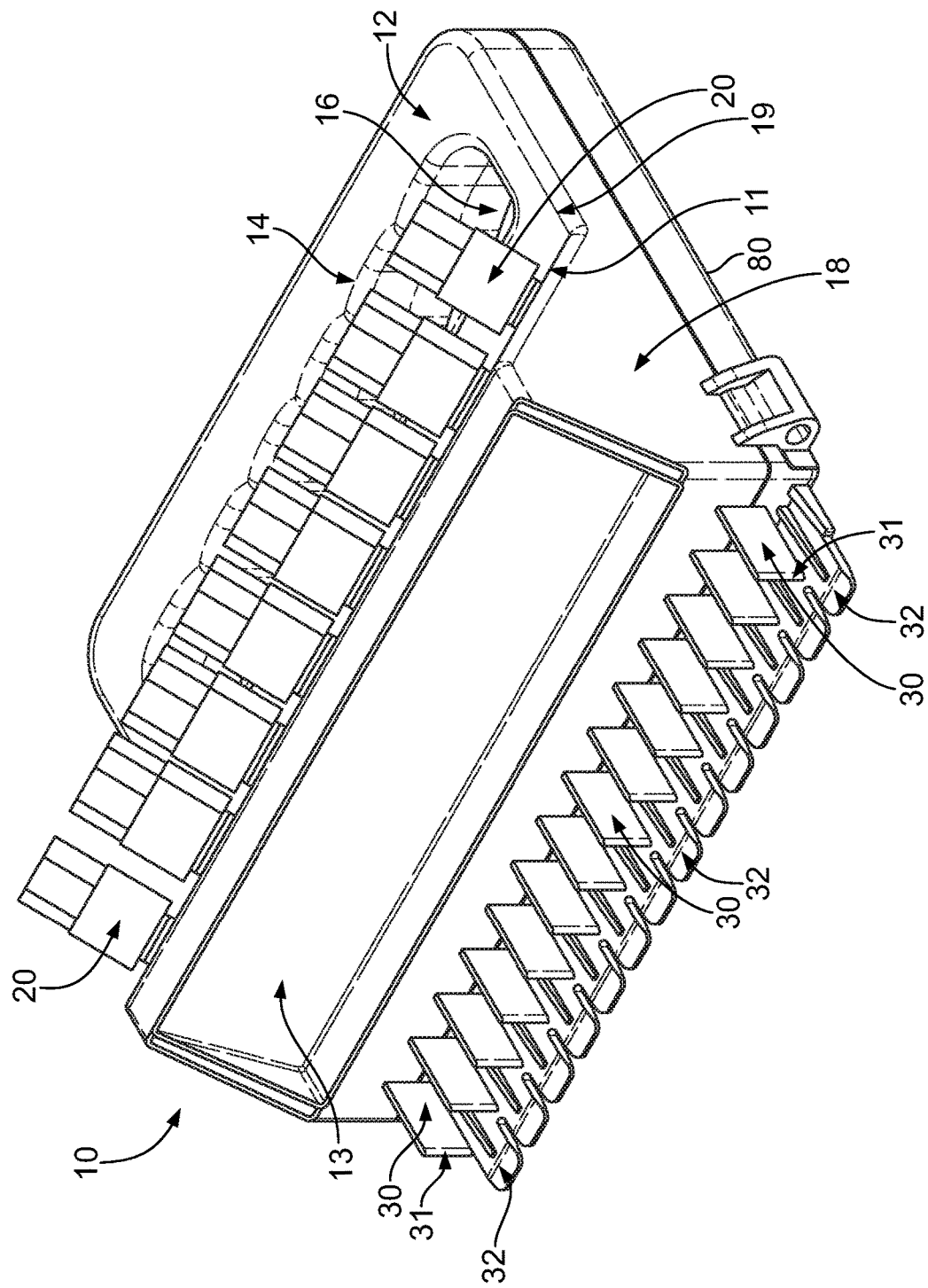
FIG. 2 is a view of the test plug showing the plurality of inputs on a first side of the test plug and a plurality of blades on a second side of the test plug.

With reference to FIG. 2, the fingers 32 extend beyond an edge surface 31 of the corresponding blades 30, as the fingers 32 are longer than the respective blades 30. This arrangement allows the fingers 32 to break the current jack 44 electrical connection of the test switch 40 before electrical contact is made between the test plug 10 and the test switch 40. The test plug blades 30 are then inserted into the test switch 40 jaws 46 and make electrical contact. As will be appreciated in FIG. 2, the blades 30 and fingers 32 take on an alternating arrangement. The blades 30 and fingers can be interlaced in any number of arrangements.

Figure 4:
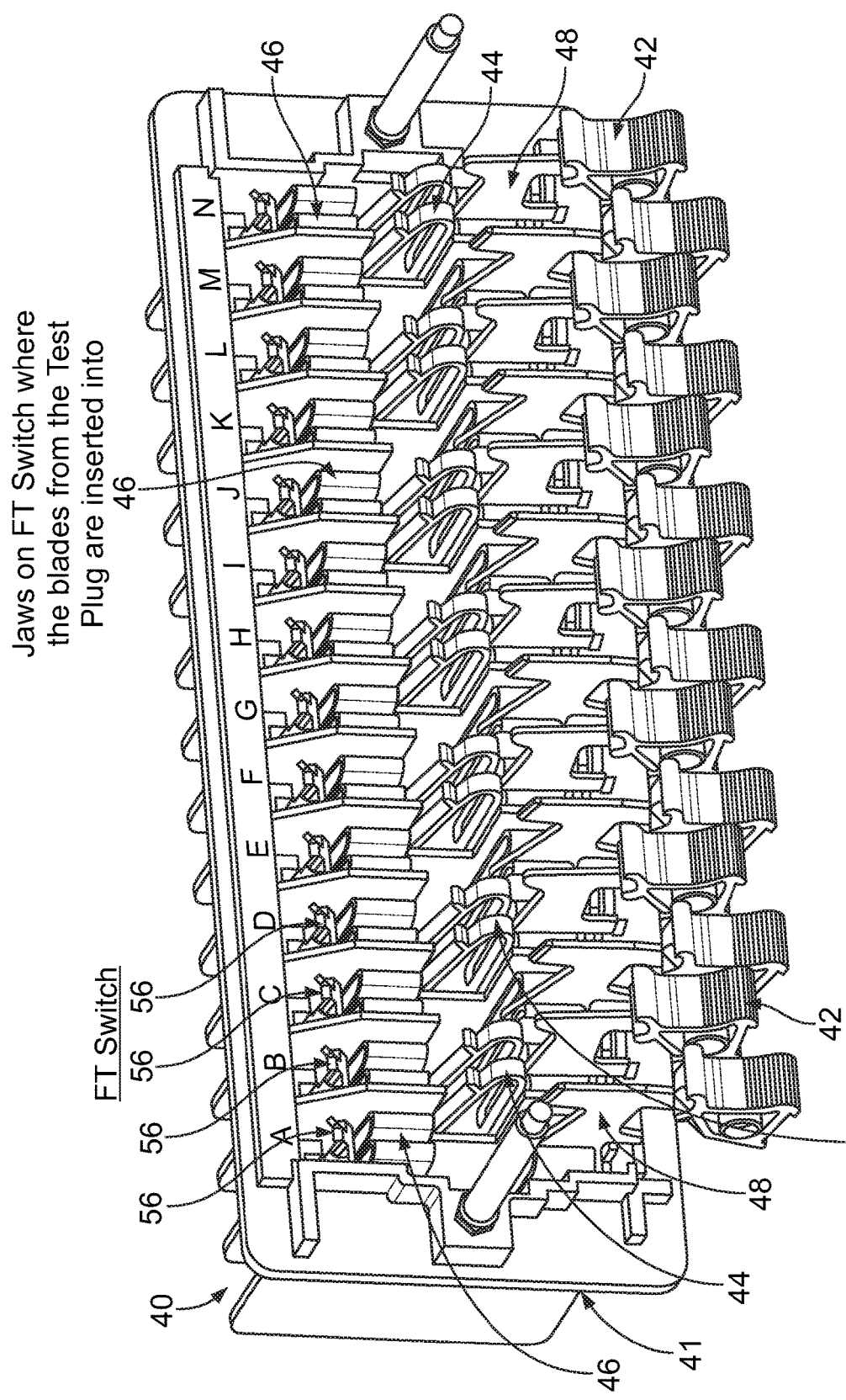
FIG. 4 is a front view of the test switch showing the blades in an open position with respect to the corresponding test switch jaws and current jacks.
Figure 5A:
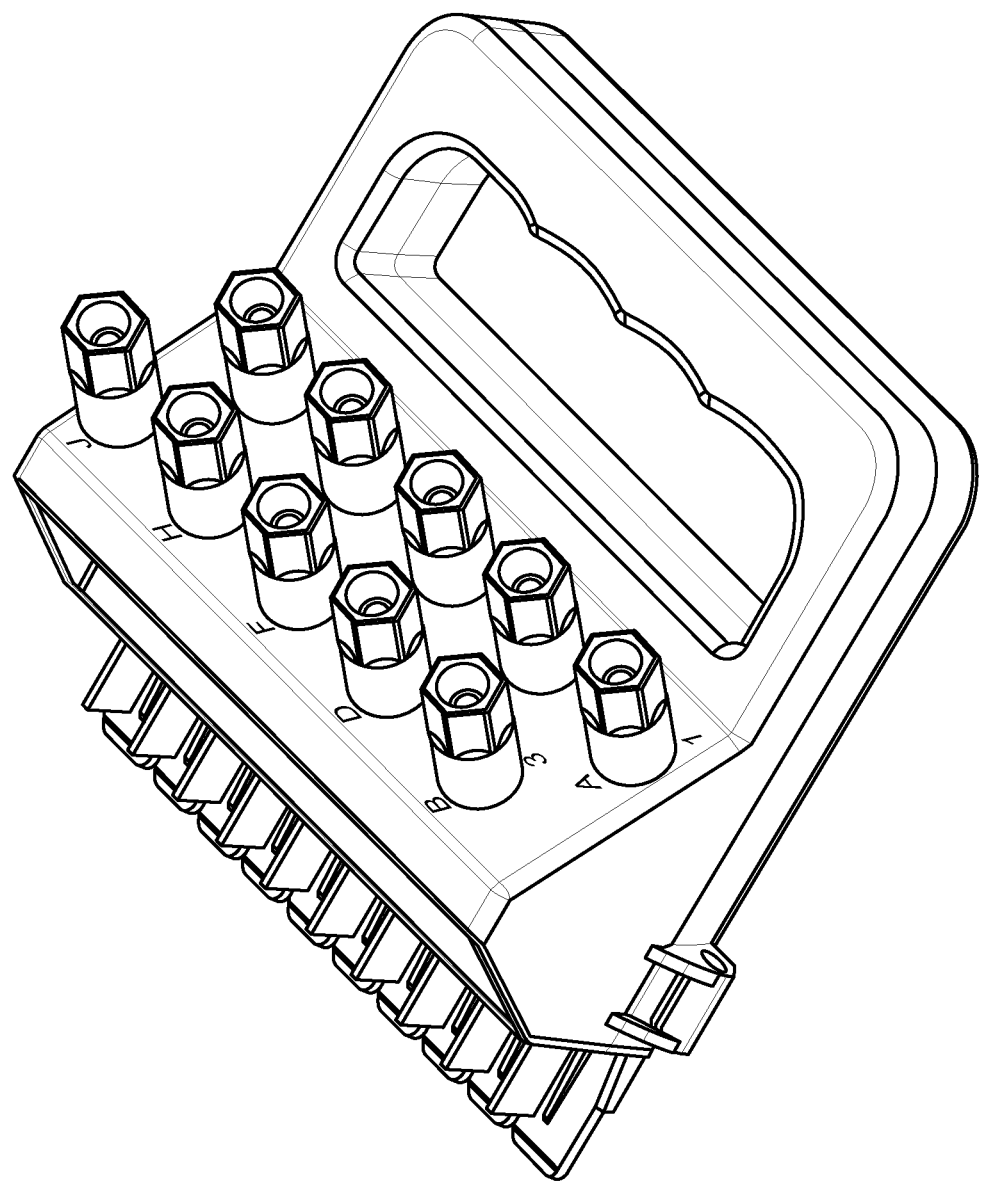
FIGS. 5a-5d depict embodiments of test plugs.
Figure 5B:
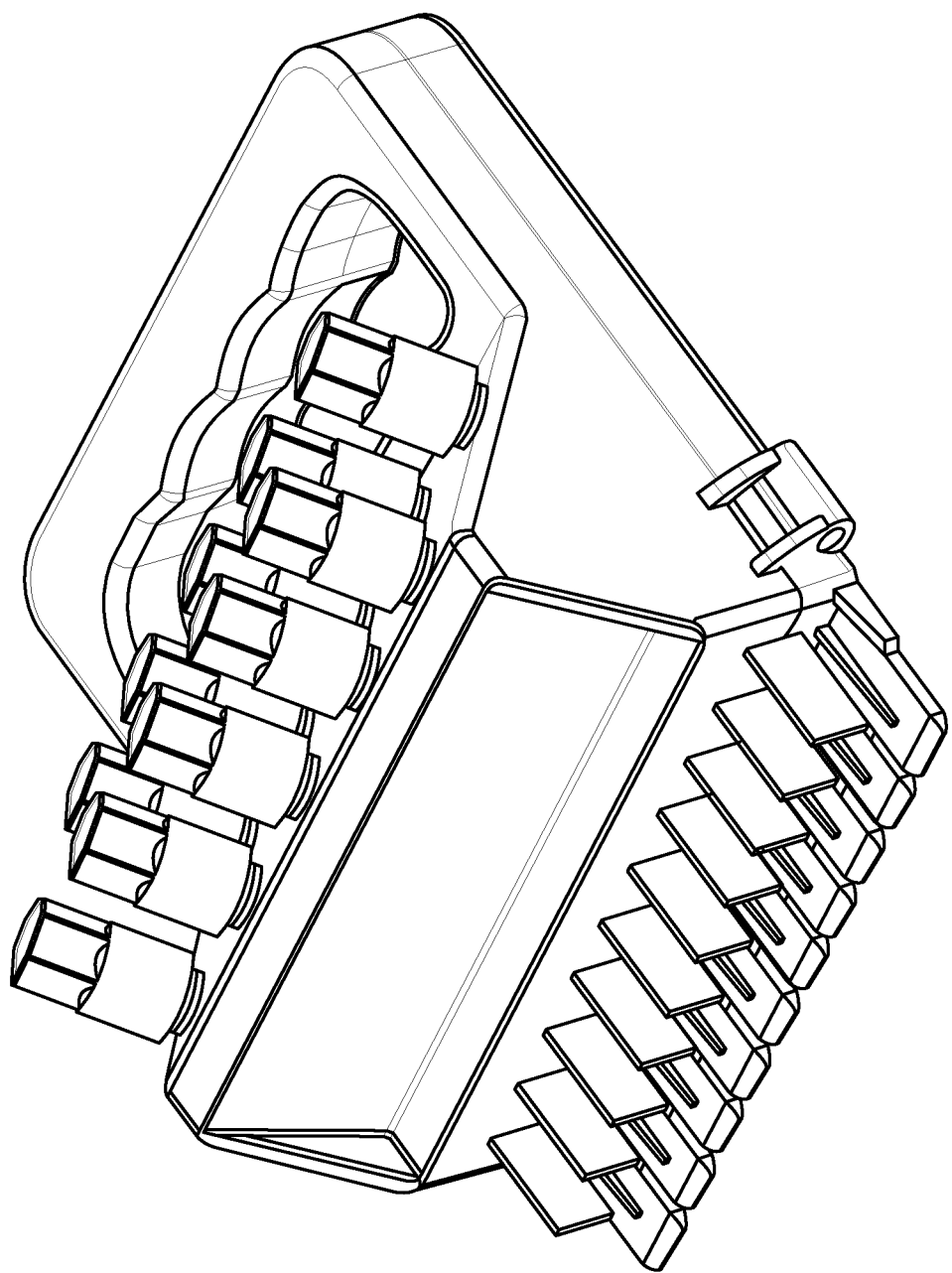
Figure 5C:
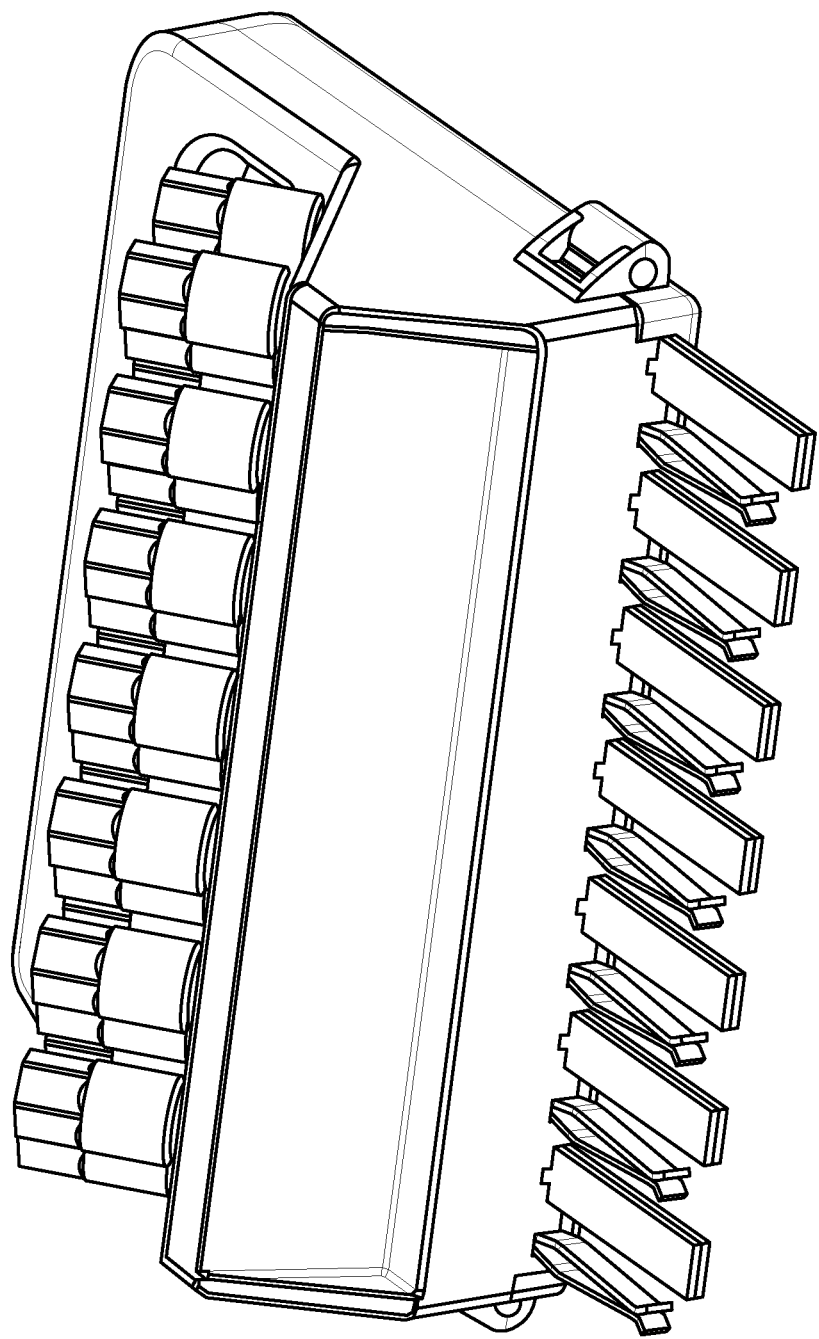
Figure 5D:
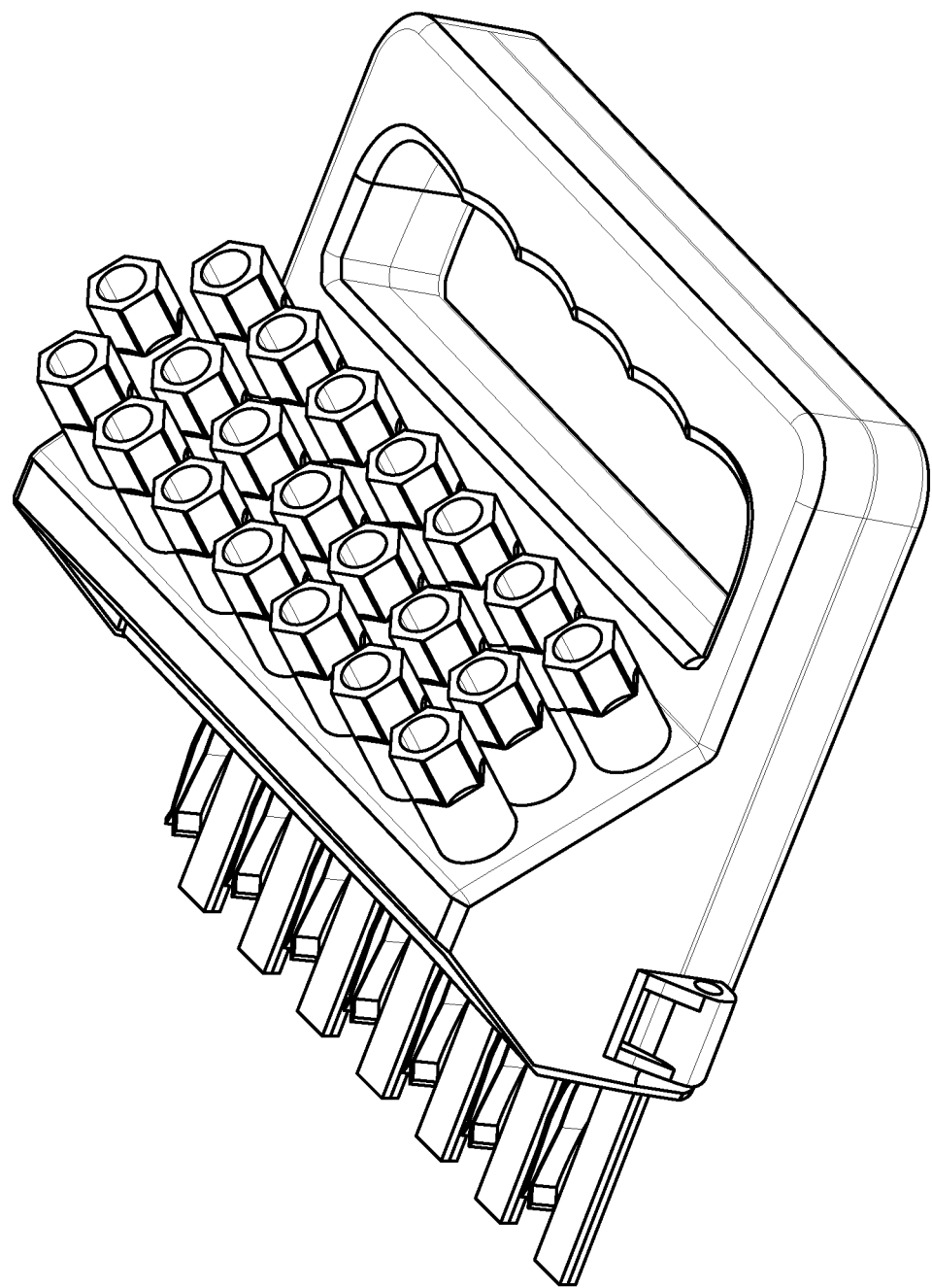

Referring now to FIG. 4, the test switch 40 has a mounting base 41 and a plurality of poles 56. Each of the plurality of poles 56 has a handle 42 attached to a knife-like blade 48 that is a shorting or a non-shorting blade. The knife-like blades 48 are secured to the test switch 40 base 41. The poles 56 are embodied as current poles configured in sets of at least two current poles, (C-C), for use with current circuits, and comprise a current test jack, a shorting spring, a shorting blade, and the non-shorting blade. Alternatively, the poles 56 are configured as single, non-shorting knife blades and are used in potential, trip, or control circuits. The poles 56 are releasably connected to the test switch 40 housing 41 by a nut (not shown). The handles 42 of the test switch 40 are provided for access to open and close the blades 48 of each pole 56 of the test switch 40. The blades 48 are in an open position and non-contact position with respect to the jaws 46 and the current jacks 44 when the test plug 10 is engaged with the test switch 40.

With reference now to FIGS. 5(a)-(d), embodiments of the test plug 10 is shown for in-service testing. The in-service test plug 15 has inputs 20 on the first side 11 of the housing 18. The housing 18 first side 11 extends at the oblique angle from the base 19 for ease of operator access to the inputs 20, especially in installations where the location of the test plug 15 due to height, depth of placement and restrictions on access of the test plug 15 are present. The in-service test plug 15 has blades that extend horizontally with respect to the base and a series of prongs for potential blades, and may not include the make before break feature of the test plug 10. The blades of FIGS. 5c and 5d can interface directly with a complementary feature of an embodiment of the FT switch, or can be engaged with other structured that interfaces with a complementary feature of an FT switch.

Figure 6:
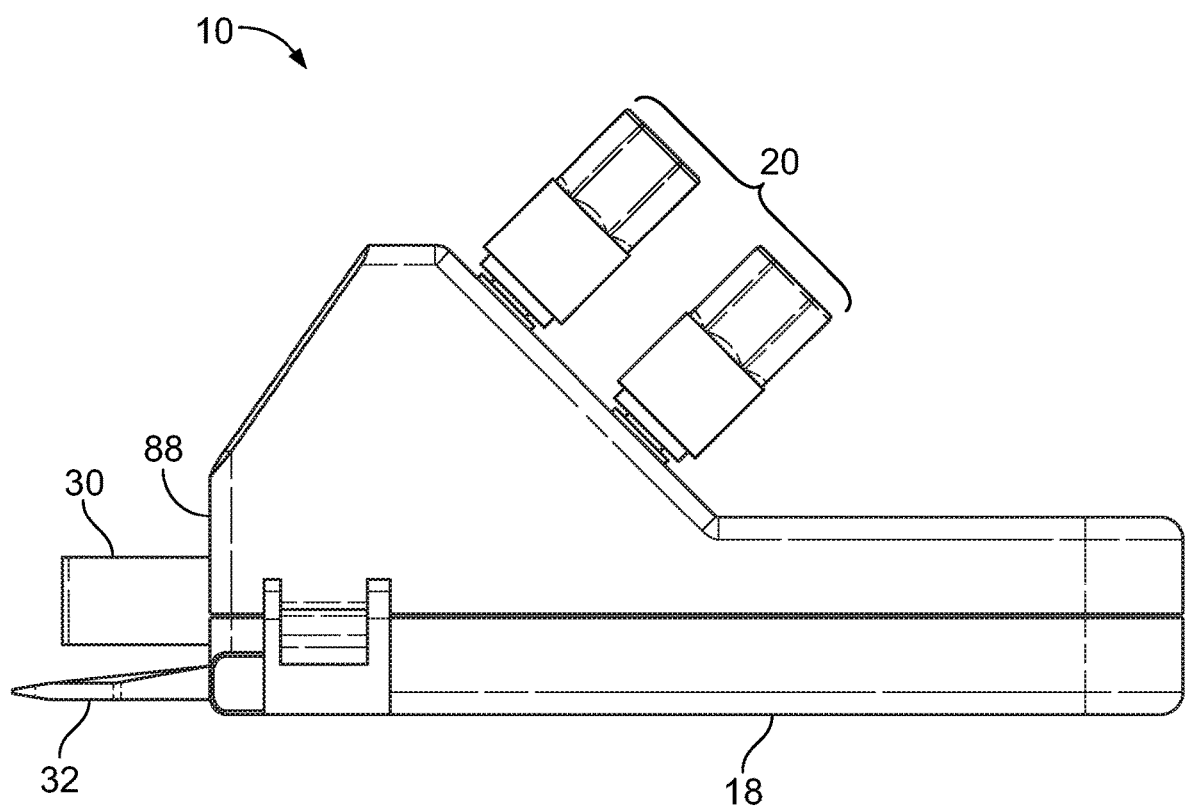
FIG. 6 is a front view of an in-service test plug.

FIG. 6 depicts another view of the test plug 10 embodiment depicted in FIGS. 1-4. As is further appreciated in the view of FIG. 6, the fingers 32 extend from a back side 88 of the housing 18 a further distance than the blade 30. Such extension permits a break before make feature when inserting the test plug 10 into an interface engagement with an FT terminal switch.

Figure 7:
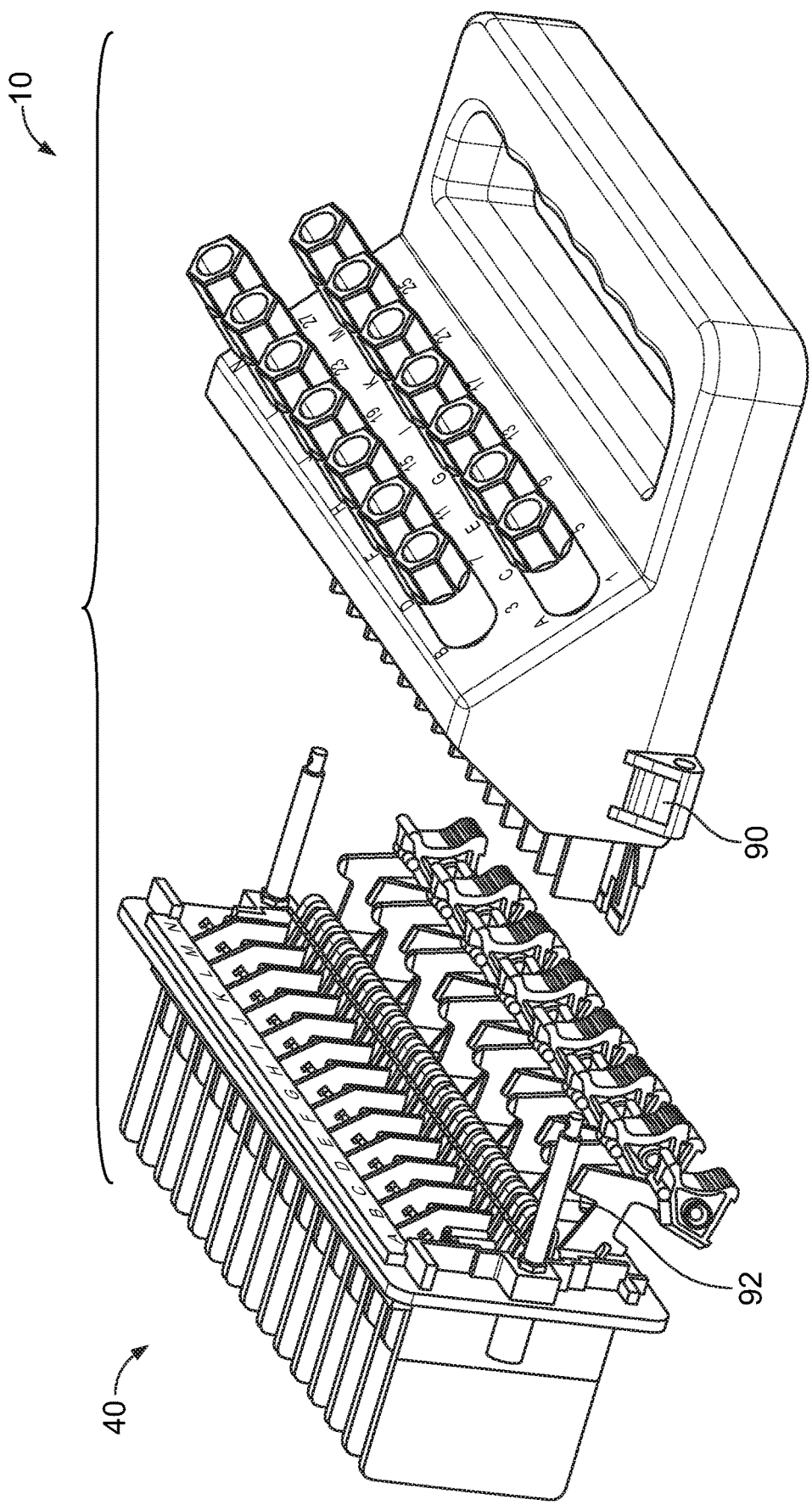
FIG. 7 is a front view of an in-service test plug.
Figure 8:
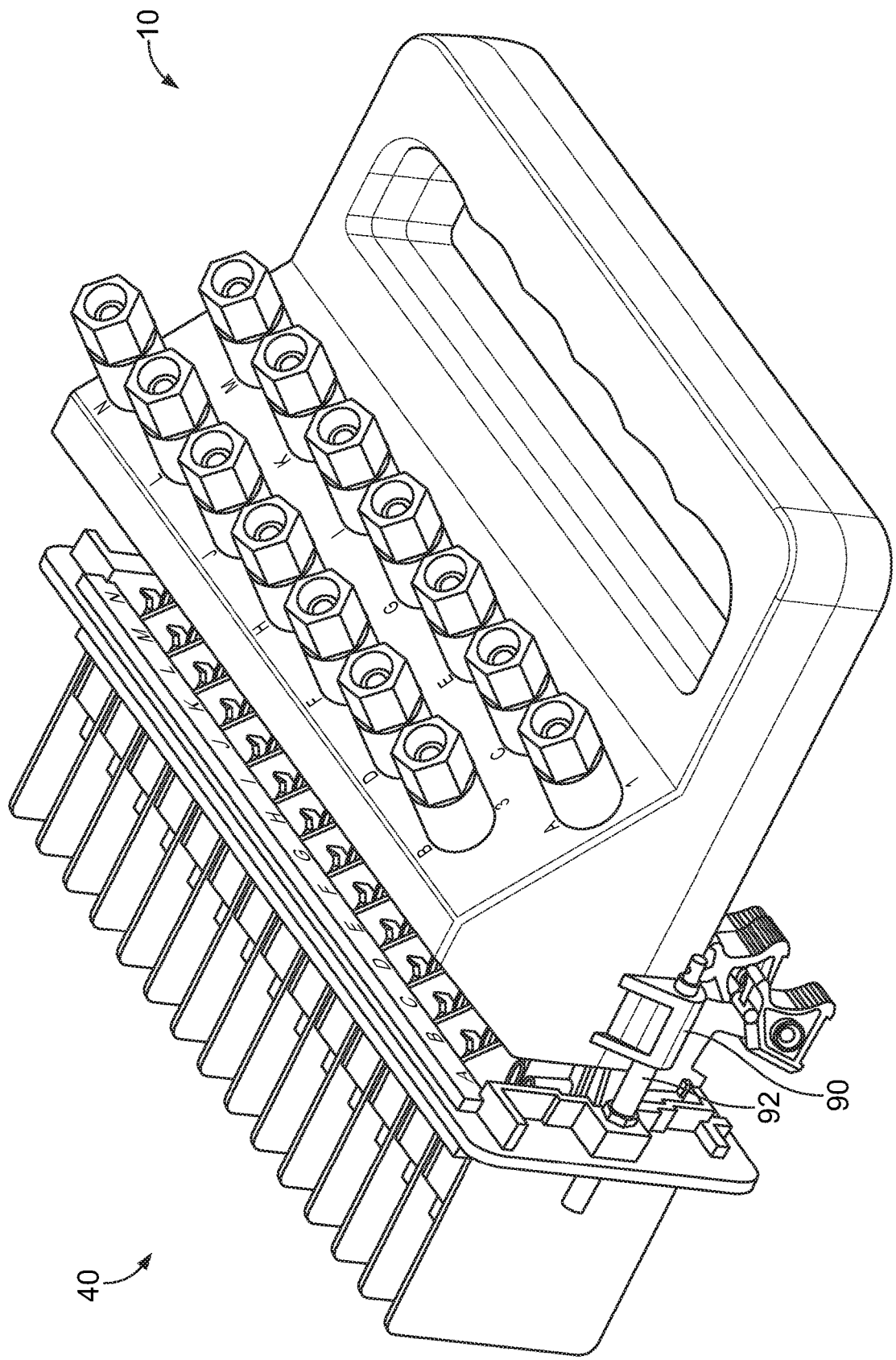
FIG. 8 is a front view of an in-service test plug.

FIG. 7 illustrates embodiments of the test plug 10 and FT switch 40 in an unengaged state. FIG. 7 also illustrates in further detail the interface nature of the engagement. Test plug 10 includes an engagement surface 90 structured to engage an engagement surface 92 of the FT switch 40. The engagement surface 90 can take the form of an opening sized to receive a form of the engagement surface 92 in the shape of a rod. Various interface types are contemplated, including one in which the engagement surface 90 is in the form of a rod and the engagement surface 92 is in the form of an opening. The engagement surfaces 90 and 92 can be structured to support all or substantially all of the load of the test plug 10. Other alternative and/or additional embodiments contemplate that the fingers 32 may be used to support all or a portion of the load of the test plug with the engagement surfaces 90 and 92 useful to provide lateral support as the test plug 10 is engaged with the FT switch 40.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

The invention claimed is:

1. An apparatus comprising:
a test plug structured to engage and make an electrical connection with an FT switch, the test plug having:
a housing shell having a housing interior;
a plurality of insulating fingers projecting from a side of the housing between respective finger bases at the housing and finger tips on opposite end from the finger bases, the fingers structured to separate an electrical contact in the FT switch, the plurality of insulating fingers being formed as a part of the housing shell;
a plurality of conductive leads projecting from the side of the housing along the plurality of insulating fingers and extending a distance from the housing less than a distance between the finger tips and the housing; and
wherein the relative distance between the conductive leads and the fingers provides a break-before-make connection when the FT switch and the test plug are moved into interconnection.

2. The apparatus of claim 1, which further includes a handle formed in the housing and having a handle opening through which a user's fingers may be inserted when manipulating the test plug as it is engaged or disengaged from the FT switch.

3. The apparatus of claim 2, wherein a bottom surface of the housing extends from the handle to a base of the insulating fingers.

4. The apparatus of claim 1, wherein the conductive leads are configured as conductive blades having a flattened shape and which are oriented in an upright configuration between neighboring insulating fingers, wherein the housing interior includes a plurality of supports extending from a bottom surface of the housing shell into the housing interior, each of the plurality of supports including a slotted heel for receiving respective ones of the conductive blades in the upright configuration.

5. The apparatus of claim 4, wherein the blades are constructed from a stamped conductive element, and wherein the stamped conductive element rests upon a support formed within the housing.

6. The apparatus of claim 1, wherein the housing forms a handle, the handle including finger recesses structured to receive fingers when the handle is grasped.

7. The apparatus of claim 6, wherein the housing includes a top shell and a bottom shell, each of the top shell and bottom shell having a molded thermoplastic construction.

8. The apparatus of claim 7, wherein the housing shell further including an interface panel on a top side angled between 30-60 degrees of a planar bottom of the housing.

9. The apparatus of claim 8, wherein the angle of the top side is 45 degrees relative to the planar bottom of the housing, and wherein the housing further includes a first support extending from a first side and a second support extending from a second side, the first support and second support structured to engage a supporting member from the FT switch.

10. An apparatus comprising:
a test plug configured to be complementarily engaged with a terminal switch block to provide electrical connection therebetween, the test plug having:
a housing having a planar bottom, the housing forming a handle at a handle end, the housing including an open interior and a plurality of supports extending from the bottom into the open interior, each of the plurality of supports including a slotted heel;
a plurality of insulating fingers extending from the housing at an operative end of the housing;
a plurality of conductive leads protruding from the housing and interlaced between the plurality of insulating fingers; and
a test lead interface located on an interface side of the test plug and having a plurality of test inputs for connection to external cabling, the test lead interface angled to the planar bottom between 30 and 60 degrees, wherein each of the plurality of conductive leads extends into the open interior of the housing and into a respective one of the slotted heels of the plurality of supports, and further extend from the respective one of the plurality of supports for connection to a corresponding one of the plurality of test inputs.

11. The apparatus of claim 10, wherein the housing includes a housing shell having a first shell joined to a second shell housing shell.

12. The apparatus of claim 10, wherein the insulating fingers are integral with the housing shell, wherein the conductive leads extend inward into the open interior in an upright configuration and into the respective ones of the slot heels.

13. The apparatus of claim 10, wherein the test lead interface includes test inputs for connection with a style of connector including at least one of banana-style, space, and probe type connectors.

14. The apparatus of claim 13, wherein the test lead interface is oriented at an angle relative to the direction of insertion of the test plug to the terminal block.

15. The apparatus of claim 10, wherein the housing forms a handle, the planar base extending from the handle to the base of the finger, and wherein the housing is a thermoplastic material.

16. The apparatus of claim 10, wherein the housing of the test plug includes a connection member structured to engage a complementary connection member associated with the terminal switch block, the connection member and complementary connection member forming a supporting structure to stabilize the connection and otherwise bear a load of the test plug as it is inserted into the terminal switch block.

17. The apparatus of claim 16, wherein the connection member is a recess on a side of the housing that is structured to engage an elongate rod of the complementary connection member to laterally support the test plug on the terminal switch block.

18. A method comprising:
providing a test plug having a planar base, a handle molded into a housing of the test plug, and an interface panel oriented at an angle relative to the planar base, the interface panel including a plurality of test inputs;
inserting the test plug into a test switch input of an electrical device, the electrical device having at least one component structured to be electrically connected to the test plug test inputs via insertion of the test plug into the test switch input wherein the inserting includes inserting a rod into an opening located on a side of the planar base to laterally support the test plug on the electrical device: and grasping a handle molded into a housing of the test plug to remove the test plug from the test switch input;

wherein the test plug includes a plurality of insulating fingers extending from the housing interlaced with a plurality of conductive leads, and which further includes separating an electrical contact in the test switch input by insertion of the insulating fingers.

19. The method of claim 18, which further includes engaging a test conductor to at least one of the test plug inputs.

* * * * *